United States Patent
Downing

[11] Patent Number: 5,998,790
[45] Date of Patent: Dec. 7, 1999

[54] TRANSMISSION ELECTRON MICROSCOPE CCD CAMERA

[75] Inventor: Kenneth H. Downing, Lafayette, Calif.

[73] Assignee: The Regents of the University of California, Oakland, Calif.

[21] Appl. No.: 09/100,458

[22] Filed: Jun. 18, 1998

Related U.S. Application Data

[60] Provisional application No. 60/050,435, Jun. 18, 1997.

[51] Int. Cl.⁶ .......................... H01J 37/26; H01J 37/244
[52] U.S. Cl. .......................................... 250/311; 250/397
[58] Field of Search ...................................... 250/311, 397

[56] References Cited

U.S. PATENT DOCUMENTS

| | | | |
|---|---|---|---|
| 5,065,029 | 11/1991 | Krivanek | 250/311 |
| 5,578,821 | 11/1996 | Meisberger | 250/311 |
| 5,717,207 | 2/1998 | Koguchi et al. | 250/311 |

OTHER PUBLICATIONS

Daberkow et al. Development and Performance of a Fast Fibre–Plate Coupled CCD Camera at Medium Energy and Image Processing System for Electron Holography, Ultramicroscopy 1996, V.64, pp. 35–48, Elsevier Science.

Deruijter et al., Imaging Properties and Applications of Slow–Scan Charge–Coupled Device Cameras Suitable for Electron Microscopy, Micron, 1995, v. 26, pp.247–275 Elsevier Science Ltd., Graet Britain.

Faruqi et al.,A High Sensitivity Imaging Detector for Electron Microscopy, Nuclear Instruments and Methods in Physics Research A, 1995, v. 367, pp. 408–412, Elsevier.

National Electrostatics Corp., Large High Gradient Accelerating Tube, 1995, Nov. Brochure, 4 pages, NEC, USA.

Sherman et al., Performance of a Slow–Scan CCD Camera for Macromolecular Imaging in a 400 KV Electron Cryomicroscope, Micron, v. 27, pp. 129–139, 1996, No.2, Elsevier.

Van Zwet et al., Measurement of the Modulation Transfer Function of a Slow–Scan CCD Camera on a TEM Using a Thin Amorphous Film as a Test Signal, Ultramicroscopy, 1996, v.64, pp. 49–55, Elsevier Science.

Weickenmeir et al., Quantitative Characterization of Point Spread Function and Detection Quantum Efficiency for a YAG Scintillator Slow Scan CCD Camera, Optik, 1995 v.99, No. 4, pp. 147–154, Stuttgart, Germany.

*Primary Examiner*—Jack I. Berman
*Attorney, Agent, or Firm*—Henry P. Sartorio

[57] ABSTRACT

In order to improve the performance of a CCD camera on a high voltage electron microscope, an electron decelerator is inserted between the microscope column and the CCD. This arrangement optimizes the interaction of the electron beam with the scintillator of the CCD camera while retaining optimization of the microscope optics and of the interaction of the beam with the specimen. Changing the electron beam energy between the specimen and camera allows both to be optimized.

16 Claims, 3 Drawing Sheets

TRANSMISSION ELECTRON MICROSCOPE CCD CAMERA

This application claims priority of provisional application Ser. No. 60/050,435 filed Jun. 18, 1997, which is herein incorporated by reference.

This invention was made with U.S. Government support under Contract No. DE-AC0376SF0098 between the U.S. Department of Energy and the University of California for the operation of LAWRENCE BERKELEY NATIONAL LABORATORY (LBNL). The U.S. Government may have certain rights to this invention.

BACKGROUND OF THE INVENTION

1. Field of the Invention

This invention relates generally to charge coupled device (CCD) cameras and more specifically to CCD cameras used in transmission electron microscopes (TEMs).

2. Description of the Related Art

Slow-scan CCDs are becoming widely used on electron microscopes, and under some conditions they provide an improvement in data quality over photographic film as well as the obvious advantages of direct digital readout. However, the CCD performance is seriously degraded on Intermediate Voltage Electron Microscopes (IVEMs) operating at 300–400 kV compared to the more conventional 100 kV microscopes. Because the IVEM is becoming more widely used, poor performance of the CCD camera is limiting.

Up until now, the performance of the CCD with high energy electrons has been significantly inferior to that of photographic film, making it impractical to use the CCD for image recording in many biological applications. High-quality image data cannot be collected directly with the CCD camera as needed for high-resolution electron crystallography of proteins and tomographic studies of cell ultrastructure.

There are numerous benefits to raising the voltage in an electron microscope. As the accelerating voltage increases, both elastic and inelastic scattering cross sections decrease, so that thicker specimens can be used. This is of particular importance with frozen hydrated preparations of larger molecules and assemblies and with embedded sections studied by tomography for three-dimensional visualization. Also the single-scattering approximations that are fundamental to much of the image interpretation and processing improve with increasing voltage, so that the data is a better representation of the specimen. The envelope function for temporal coherence improves, so it is easier to routinely obtain high resolution. Since the depth of field is larger, the area of a tilted specimen that is close to focus is larger. The diffraction-limited spot size is smaller, so spot-scan imaging can be done with a smaller illumination spot. Focus ramp correction with spot scan imaging can even ensure that the entire image will be at essentially the same focus. The gun brightness is higher, providing some improvement in coherence and/or exposure time. Each of these factors provides an incremental improvement, and taken together the difference is quite substantial. It is indeed this combination of factors that is still driving microscope manufacturers to improve intermediate and high voltage microscopes, and the voltage of what is considered the "routine" microscope continues to increase.

In biological applications, high voltage microscopes were initially used exclusively for their high penetration with thicker specimens. Stable IVEMs, operating at 300–400 kV are used for high resolution protein structure work as well. Camera resolution remains a limiting factor in using current IVEMs. In many potential applications, e.g. crystallography and the study of single molecule structures, digitization and high resolution CCD instrumentation would be highly advantageous to study the structures.

Electron microscopy would be enhanced by improved data collection and processing techniques. Among the advances that could greatly improve the efficiency of data collection is the development of the full potential of CCD cameras to electron microscopy. Slow-scan CCDs are used, and in some instances have completely replaced photographic film for data collection. Particularly with 100 kV microscopes, there are suggestions that the CCD is at least as good as film. However, virtually all of the quantitative analyses of CCD performance demonstrate that the quality of data collected with the CCD is compromised by certain of the system characteristics. This is true at any voltage but the problems increase with increasing voltage. Of particular impact is the point spread function, which is broadened by scattering (lateral straggling) of the electrons within the scintillator. This problem is especially aggravated at higher voltages, which appears to be the one disadvantage of the intermediate voltage microscopes. Given the number of advantages of high voltage, though, it is apparent that the WEM will more and more be the instrument of choice for structural studies.

A review of the literature gives a rather unfavorable picture of the potential for using a CCD on an IVEM. Daberkow et al. "Development and performance of a fast fibre-plate coupled CCD camera at medium energy and image processing system for electron holography" Ultralicroscopy 64, 35–48 (1996) have presented calculations and measurements that show a drastic falloff in the detective quantum efficiency (DQE) on going from 100 to 300 kV. To some extent the DQE loss can be avoided with a thick scintillator, but only at the cost of a rather wide point spread function (PSF); for example the PSF is wider than 60 $\mu$m for any condition that provides a DQE of over 0.5 at 300 kV. The situation is not quite as bad at 200 kV, but still substantially worse than 100 kV. Faruqi et al. "A high sensitivity imaging detector for electron microscopy" Nucl. Instrum. & Methods in Phys. Res. A 367, 408–412 (1995) also used a thicker scintillator to improve sensitivity, but obtained a PSF well over 50 $\mu$m (FWHM) even at 120 kV. Weickenmeier, et al. "Quantitative characterization of point spread function and detection quantum efficiency for a YAG scintillator slow scan CCD camera" Optik 99, 147–154 (1995) measured a modulation transfer function (MTF) for CCD systems that falls below 0.2 even at 120 kV. DeRuijter "Imaging properties and applications of slow-scan charge-coupled device cameras suitable for electron microscopy" Micron 26, 247–275 (1995) compared 100 and 300 kV operation, showing a loss of about a factor of two in MTF at the higher voltage, and also provides a good discussion of other noise sources that have made some MTF measurements appear anomalously favorable. The main problem is that noise within the scintillator, such as from the wide pulse height distribution of photons per incident electron, is not damped by the MTF and thus adds a finite amplitude to the power spectrum at high spatial frequencies. MTF measurements based only on the Fourier transform or autocorrelation of the input will be biased toward high values by this noise source. Van Zwet and Zandbergen "Measurement of the modulation transfer function of a slow-scan CCD camera on a TEM using a thin amorphous film as test signal" Ultramicroscopy 64, 49–55 (1996) illustrate the difference in MTF measurements made with different techniques. Results presented by Sherman et al. "Performance of a slow-scan CCD camera for macromolecular imaging in a 400 kV electron cryomicroscope" Micron 27, 129–139 (1996) are among the most favorable, but still show a strong loss of both signal and signal to noise ratio at high resolution, compared to film.

SUMMARY OF THE INVENTION

The invention is a CCD camera adaptation for use in high voltage TEMs in which the electrons will be decelerated to around 100 kV before impacting the CCD camera The CCD is floated at a high voltage below a decelerator in a high voltage isolation mounting. This arrangement allows a substantial improvement in both signal level and resolution, by greatly reducing the volume of the scintillator within which the electrons deposit their energy. Further improvements can be obtained from the use of a very thin, high-efficiency scintillator materials, e.g. vacuum deposited CsI.

The inventive CCD camera takes advantage of all of the features of the IVEM in interactions for the beam with the specimen, but overcomes the limitations of the CCD with high voltage electrons. This development will make CCD cameras far more functional in many biological applications. The benefits will, of course, not be limited to low-dose work, although this is where the most dramatic improvements should be seen.

DETAILED DESCRIPTION OF INVENTION

The present transmission electron microscope (TEM) charge coupled device (CCD) camera improves recorded image resolution without increasing microscope magnification. Increasing microscope magnification is an unsatisfactory way of increasing resolution because it results in a smaller number of molecules, or a smaller area of sample, being recorded on a given size CCD chip, limiting the ability to relate one part of the sample with another part. The present camera uses a series of lens electrodes to decelerate the TEM electrons to about 100 kV before they enter the CCD camera scintillator. This significantly reduces the noise component reaching the CCD chip. The TEM CCD camera comprises an electron decelerator located adjacent to a transmission electron microscope and a CCD camera on the low energy side of the decelerator. The decelerator comprises a plurality of lens electrodes separated by electrical insulators, and means to connect voltages to the electrodes. The camera comprises scintillator material, a CCD chip, fiber optic material located so as to transfer photons generated by the scintillator to the CCD chip, and electronics connected to the CCD chip that are capable of converting the electrical signals to an image.

Binning adjacent pixels to compensate for a broad PSF is not useful because it decreases the specimen area. None of the alternatives to pixel binning as a way to overcome the wide PSF, including lens coupling with demagnification, reducing fiber optics, and thinning the scintillator, provide sufficient light coupling to the CCD to ensure an adequate signal. Noise introduced by the wide pulse-height spectrum produced at high voltages seriously degrades the DQE, leading to performance at 400 kV that is not as good as film. There are inherent limitations to CCD camera performance at higher voltages. One solution used in the CCD camera of the invention to overcome this limitation is floating the CCD at a voltage around 50–200 kV below the HV of the microscope. This will provide more signal than currently available, with a point spread function in the scintillator smaller than the CCD pixel size.

Figure 1A:
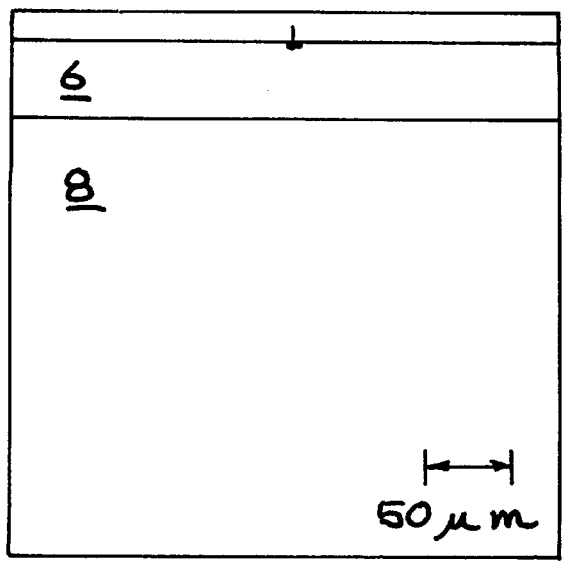
FIGS. 1a–1c are Monte Carlo calculations of electron trajectories in 50 $\mu$m thick YAG scintillators mounted on fiber optics at accelerating voltages of 50 kV, 100 kV, and 300 kV.
Figure 1B:
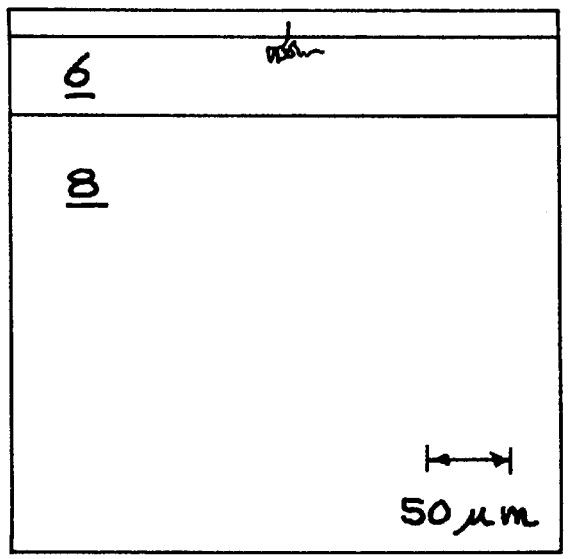
Figure 1C:
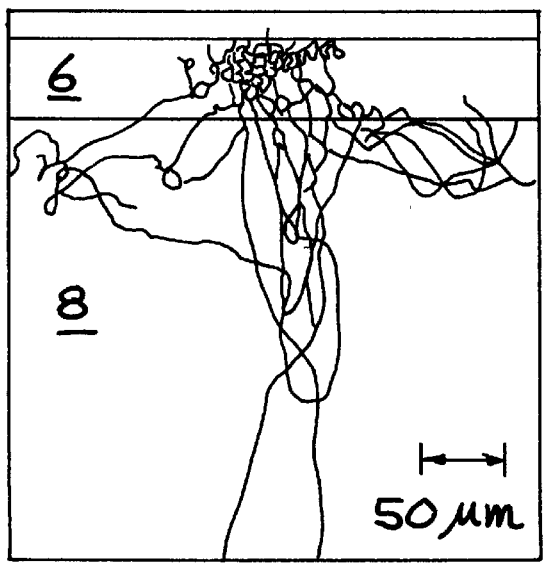

Monte Carlo electron scattering calculations demonstrate the advantages of reducing the energy of the beam incident on the scintillator (or the disadvantage of working at high voltage in general). FIGS. 1a–c show Monte Carlo calculations of electron trajectories in a YAG scintillator 6 on silicon fiber optics 8, for 50, 100 and 300 kV electrons. Although this is not an exact representation of the average electron trajectory, it will be readily apparent that even a 50 $\mu$m thick layer stops rather little of the 300 kV electron energy. Estimates based on stopping power tables are that about 20 kV is absorbed within the YAG. The 300 kV electrons scatter within the YAG over a range corresponding to several CCD pixels (24 $\mu$m pixel spacing), but an even greater contribution to the width of the point spread function is generated by electrons that travel within the fiber optic and then backup into the YAG. As many as 10% of the incident electron scatter back into the YAG, often at distances of 10 pixels from the incident site. On the other hand, the stopping power for lower energy electrons is such that all electrons are stopped within a thin layer of the scintillator, with lateral spreading of less than a pixel. This dramatic improvement is the basis for floating the CCD to a high voltage that is well matched to the scintillator and CCD performance.

Figure 2:
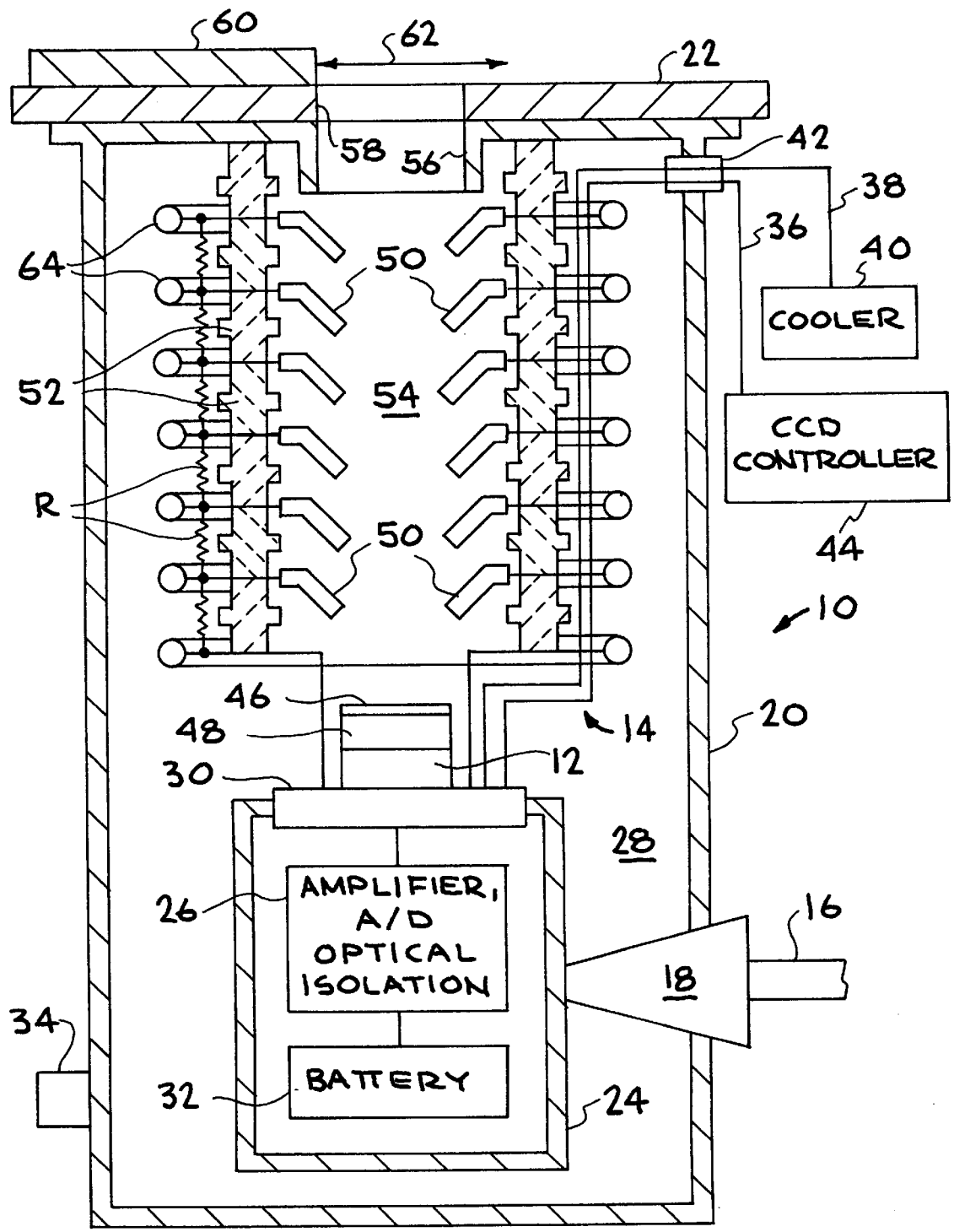
FIG. 2 is a cross sectional view of the electron decelerator and CCD mounting.

FIG. 2 shows a decelerator-CCD camera apparatus 10 for floating a CCD 12 in a decelerator 14 for use in an electron microscope. The decelerating voltage is brought in on HV cable 16 through a feedthrough 18 in a high voltage tank 20 which is attached to microscope base 22 below the microscope's viewing chamber. A box 24 containing the electronics package 26 (amplifier, A/D converter, optical isolation elements, etc.) is mounted inside tank 20 which contains pressurized (e.g. 80 psi) $SF_6$ gas in the regions 28 outside box 24 and decelerator 14. The interior of box 24 is typically at atmospheric pressure. The CCD 12 is mounted on a plate 30 that serves as a feedthrough into box 24, which will be at the high voltage during microscope operation. The electronics package 26 runs off a rechargeable battery 32, which can be connected to external power through a removable plug 34 when the decelerating high voltage is off. CCD control and output signals are transmitted through fiber optics 36. A non-conductive coolant such as Freon, circulated through coolant line 38 from an external refrigerator (cooler) 40 is used to bring the CCD temperature down to the usual −20 C., avoiding the serious power drain required to run a Peltier cooler. Fiber optics 36 and coolant line 38 pass through feedthrough 42 in tank 20 for connection to CCD controller 44 and cooler 40. A thin scintillator 46 is coupled to CCD 12 through fiber optics 48.

Decelerator 14 is formed of a plurality of staged electrodes 50 which are separated by insulators (ceramic rings) 52. The interior 54 of decelerator 14 is at vacuum (e.g. $\leq 10^{-6}$ torr) during microscope operation, and communicates with the microscope through opening 56 which matches opening 58 in microscope base 22. The aligned openings 56, 58 can be closed by sliding valve 60 which is shown in open position but can move as shown by arrow 62.

The function of decelerating electrodes 50 is to slow down high voltage electrons before they reach the CCD camera. It is important to avoid sparking. Guard rings (corona shields) 64 connect to electrodes 50 on the outside of decelerator 14 to prevent sparking in high pressure region 28. Potential grading resistors R are also connected between electrodes 50 on the outside of decelerator 14. The resistors R can be of a constant value to provide uniform voltage drops between the electrodes, or they can be of different values to provide other voltage distributions. Commercially available equipment may be used for the decelerator 14, e.g. the large high gradient accelerating tube from National Electrostatics Corp., Middleton, Wis. However, the conventional accelerator tube is used in the reverse direction, so that it will slow down rather than accelerate the electron beam. Thus, if a 300 kV beam is decelerated by 200 kV, a 100 kV beam will be incident on the scintillator/ CCD.

The Monte Carlo calculations as shown in FIGS. 1a–c indicate that the optimal energy for electrons on the scintillator may be somewhat below 100 kV. Even at 100 kV, all the electron energy is absorbed in a very small volume, possibly overcoming the serious MTF limitations of thick scintillators. However reducing the energy of the electrons incident on the scintillator to 50 kV may be even better. The incremental cost in raising the CCD voltage above 200 kV, both for the power supply and the decelerator design, makes 200 kV a reasonable upper limit for the prototype camera modification. Lower incident voltages can be tested by reducing the microscope's HV from 300 kV to 275 kV while still retaining essentially all of the advantages of the high voltage. Some of these tests of the CCD could be done with a 100 kV microscope operated at lower voltage, but then one would lose the ability to test the CCD performance under conditions ideal for protein structure work.

High voltage discharges pose a serious threat to the CCD 12 and associated electronics 26. Discharges within the $SF_6$ tank 20 are easily avoided by conservative design. A multi-step decelerator 14 above the CCD 12 minimizes the risk of a discharge in the vacuum inside decelerator 14. The electron optical properties of the decelerator would provide minimal image distortions as well as a large safety factor in high voltage isolation.

The thin scintillator 46 is fiber optically coupled through fiber optics 48 to the CCD 12. Lower voltages may permit scintillator 46 to be placed right on CCD 12 without fiber optics 48. A metallization layer on the scintillator will provide some protection as part of the Faraday shield for the electronics 26. For low-dose work a P43 phosphor is preferred because of its roughly five times higher light output compared to YAG. This is a particularly significant issue with the 400 kV microscope, where only about 20 kV is absorbed even within a 50 $\mu$m thick layer. At the lower voltage, on the other hand, nearly the full electron energy can be absorbed in a thinner layer of YAG, giving roughly the same light output within a very small lateral range. Although YAG has the disadvantage of a long, low-amplitude component to the point spread function, it provides substantial advantages in the spatial uniformity of its response and its pulse-height spectrum.

An even better alternative than YAG may be a vacuum-deposited layer of CsI, which has somewhat greater stopping power than YAG and significantly higher light output efficiency. While YAG scintillators have been mechanically thinned to around 20 $\mu$m, the thickness is not highly predictable and may tend to vary over the size of a 2 k CCD. A CsI layer can be made smaller than 20 $\mu$m, still thick enough to absorb 50–100 kV electrons, but thin enough to ensure a better MTF than could ever be obtained with polished YAG. The CsI coating will be deposited on the fiber optics by Bicron, Inc. (Newbury, Ohio). The fiber optic and coolant connections will be run up through the decelerator electrodes, inside the $SF_6$ tank, to minimize effects of field gradients and the danger of arcing.

The decelerator will have a significant lens effect. To a first approximation, the decelerating field introduces a factor of just under two in magnification. Image distortions introduced by the decelerator are removed by the type of image processing that is already part of the treatment of crystal images. Once the distortion pattern has been characterized, it should be constant for all images and could be incorporated into a routine step in image treatment The magnification of the electrostatic lens will be proportional to the square root of the voltage drop. This can be used to give an idea of the stability and ripple that would be tolerable in the high voltage supply. A first estimate of the magnification is around a factor of two. Then in order to avoid changing the magnification by an amount corresponding to one pixel at the edge of the 2 k field, i.e. 1 part in 1000, the HV needs only 1 part in 1000 stability and ripple, both of which are will within the specifications for available power supplies.

Figure 3:
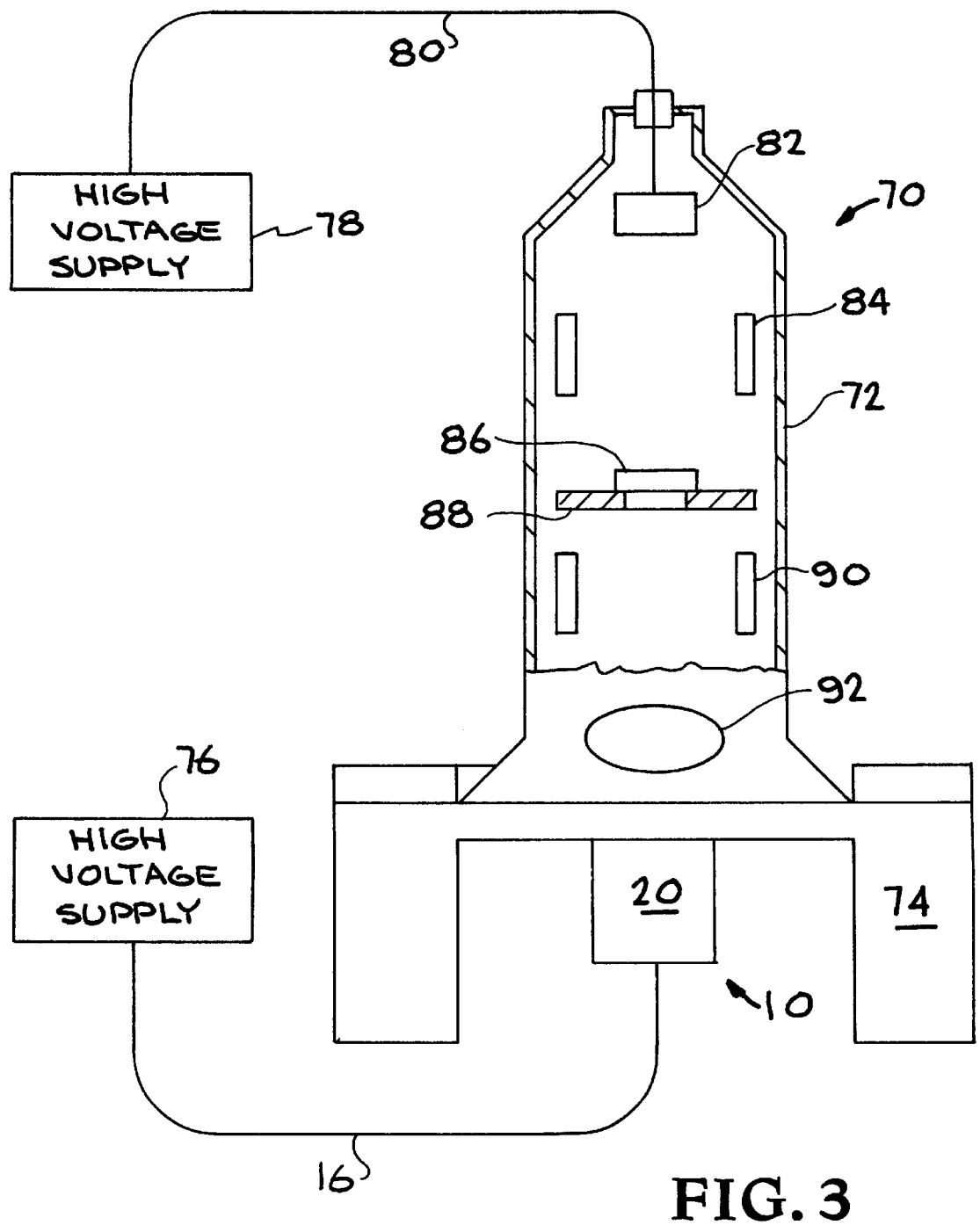
FIG. 3 is a simplified view of an electron microscope with the CCD camera of the invention.

The entire electron microscope system 70 is shown in FIG. 3. The microscope column or superstructure 72 is mounted on microscope base 74 to which the tank 20 containing decelerator CCD camera apparatus 10 of FIG. 2 is also mounted, in alignment with microscope superstructure 72. Apparatus 10 is connected through HV cable 16 to HV supply 76. A small 200 kV power supply by Gamma High Voltage, Inc. model RR200.75 can be used. A second HV supply 78 is connected through HV cable 80 to an electron beam source 82 at the top of superstructure 72. Supplies 76, 78 could be combined into one supply. The electron beam from source 82 passes through beam focusing lenses 84 and impinges on a specimen 86 positioned on a specimen mount 88. After interacting with specimen 84, the electron beam passes through magnetic lenses 90 and into the decelerator-CCD camera unit 10. A window 92 in superstructure 72 permits visual inspection.

Thus, the invention enables the competing objectives of having high voltage electrons (e.g. 300 kV–400 kV) incident on the target for better interaction and having much lower voltage electrons (e.g. 100 kV or less) incident on the scintillator/ CCD for better image quality. The invention can be implemented with available technology. The electron microscope and scintillator/CCD components are conventional, and the decelerator is commercially available.

Changes and modifications in the specifically described embodiments can be carried out without departing from the scope of the invention which is intended to be limited only by the scope of the appended claims.

I claim:

1. A decelerator-CCD apparatus for use with an electron microscope, comprising:
   a decelerator for receiving a high voltage electron beam and producing a lower voltage electron beam,
   a charge coupled device (CCD) positioned to receive the lower voltage electron beam from the decelerator.

2. The apparatus of claim 1 wherein the decelerator comprises an accelerator tube used in the reverse direction.

3. The apparatus of claim 1 further comprising a scintillator layer between the CCD and decelerator and a fiber optics bundle connecting the scintillator to the CCD.

4. The apparatus of claim 1 further comprising a scintillator layer deposited directly on the CCD.

5. The apparatus of claim 1 further comprising a tank containing the decelerator and CCD.

6. The apparatus of claim 1 further comprising a sealed electronics box mounted in the tank and connected to the CCD.

7. The apparatus of claim 6 further comprising a pressurized gas in regions of the tank outside the decelerator and electronics box.

8. The apparatus of claim 7 wherein the gas is $SF_6$.

9. The apparatus of claim 1 wherein the decelerator comprises a plurality of decelerator electrodes, and insulators between the electrodes.

10. The apparatus of claim 9 further comprising a corona shield around the decelerator.

11. The apparatus of claim 9 further comprising potential grading resistors between adjacent electrodes.

12. The apparatus of claim 6 further comprising a fiber optic cable mounted in the tank and connected to the sealed electronics box to transmit CCD control signals and CCD output signals.

13. The apparatus of claim 6 further comprising a coolant line mounted in the tank and connected to the sealed electronics box and to an external cooler to cool the CCD.

14. The apparatus of claim 1 in combination with an electron microscope.

15. The apparatus of claim 14 wherein the electron microscope comprises an electron source and a 300 kV–400 kV power supply connected to the electron source to produce a 300 kV–400 kV electron beam.

16. The apparatus of claim 15 further comprising a decelerator power supply connected to the decelerator to decelerate the electron beam to about 100 kV.

* * * * *